US 7,855,969 B2

(12) United States Patent
Vogel et al.

(10) Patent No.: US 7,855,969 B2
(45) Date of Patent: Dec. 21, 2010

(54) SELECTIVE TEST POINT FOR HIGH SPEED SERDES CORES IN SEMICONDUCTOR DESIGN

(75) Inventors: Danny Vogel, Sudbury, MA (US); Bryan Robb, Norwood, MA (US); Robert F Smith, Foxboro, MA (US)

(73) Assignee: LSI Corporation, Milpitas, CA (US)

( * ) Notice: Subject to any disclaimer, the term of this patent is extended or adjusted under 35 U.S.C. 154(b) by 1117 days.

(21) Appl. No.: 11/136,236

(22) Filed: May 24, 2005

(65) Prior Publication Data

US 2006/0268723 A1    Nov. 30, 2006

(51) Int. Cl.
*G01R 31/08* (2006.01)
(52) U.S. Cl. ...................................... 370/242; 370/248
(58) Field of Classification Search ................. 370/241, 370/242, 244, 248–9, 252, 366; 714/724–5, 714/733–8, 740–2
See application file for complete search history.

(56) References Cited

U.S. PATENT DOCUMENTS

| | | | | |
|---|---|---|---|---|
| 4,821,269 A * | 4/1989 | Jackson et al. .............. 714/724 |
| 5,732,209 A * | 3/1998 | Vigil et al. ..................... 714/30 |
| 6,252,912 B1 * | 6/2001 | Salinger ....................... 375/278 |
| 6,782,336 B2 * | 8/2004 | Shah .......................... 702/118 |
| 7,114,135 B1 * | 9/2006 | Gauvin ........................... 716/4 |
| 2002/0053056 A1 * | 5/2002 | Kuegler et al. .............. 714/733 |
| 2005/0193302 A1 * | 9/2005 | Arguelles et al. ........... 714/733 |

OTHER PUBLICATIONS

"SerDes core supports 155Mbps to 3.125Gbps", EE Times Asia, Dec. 29, 2004.*

* cited by examiner

*Primary Examiner*—Derrick W Ferris
*Assistant Examiner*—Peter Cheng
(74) *Attorney, Agent, or Firm*—Suiter Swantz pc llo

(57) ABSTRACT

The present invention is directed to a method and system for testing systems involving high speed SERDES cores by exposing an internal nature of signals. The signals are tapped at various external test points. The present invention may take one or more test points in receive and/or transmit paths of high speed SERDES cores, and expose the test points by routing signals to the pins/balls on a chip. Programmable directing (multiplexing) of signals may be utilized to restrict number of output debug ports. Consequently, the number of the pin count required for the chip may be controlled.

20 Claims, 3 Drawing Sheets

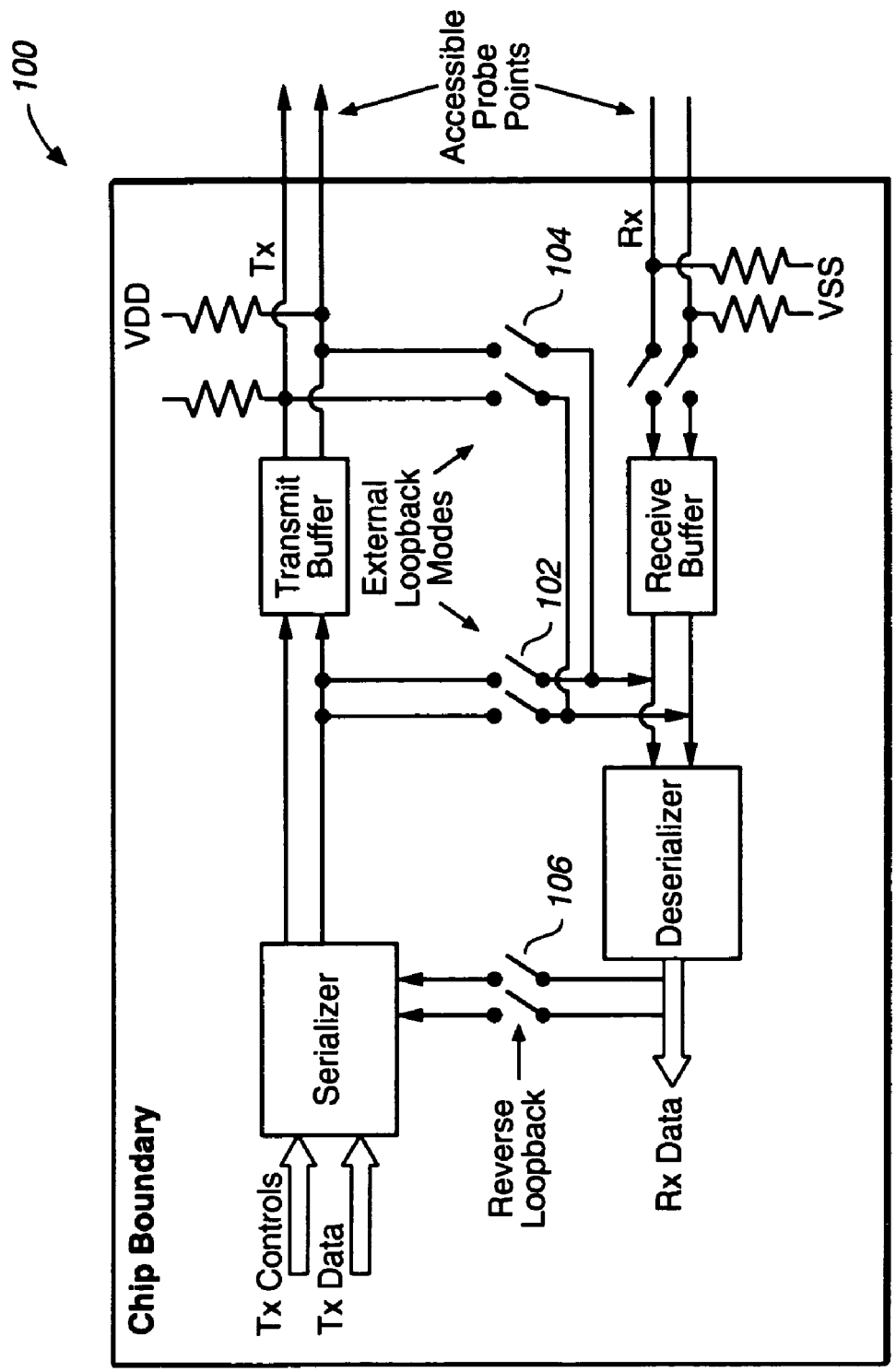
FIG._1
(PRIOR ART)

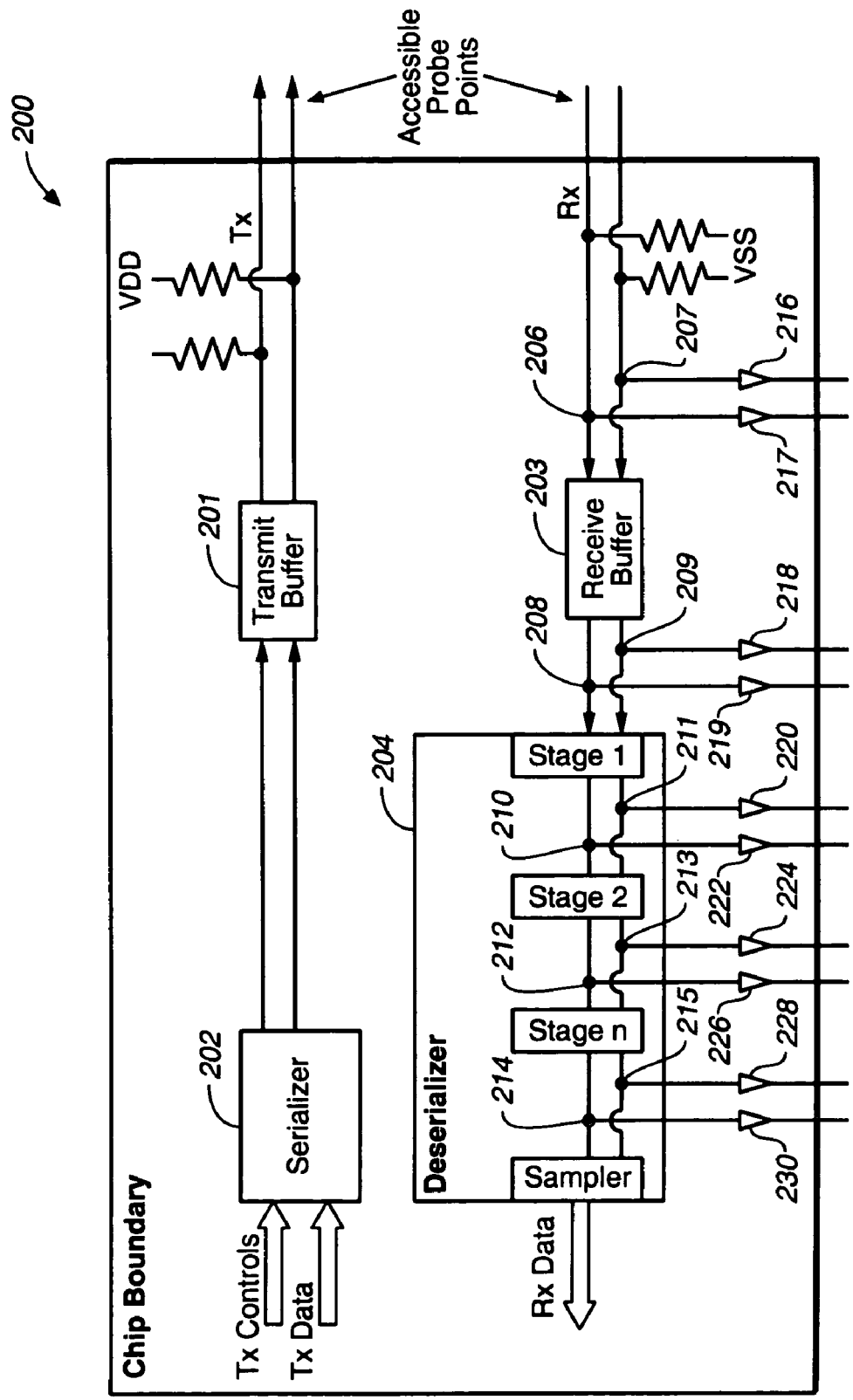
FIG._2

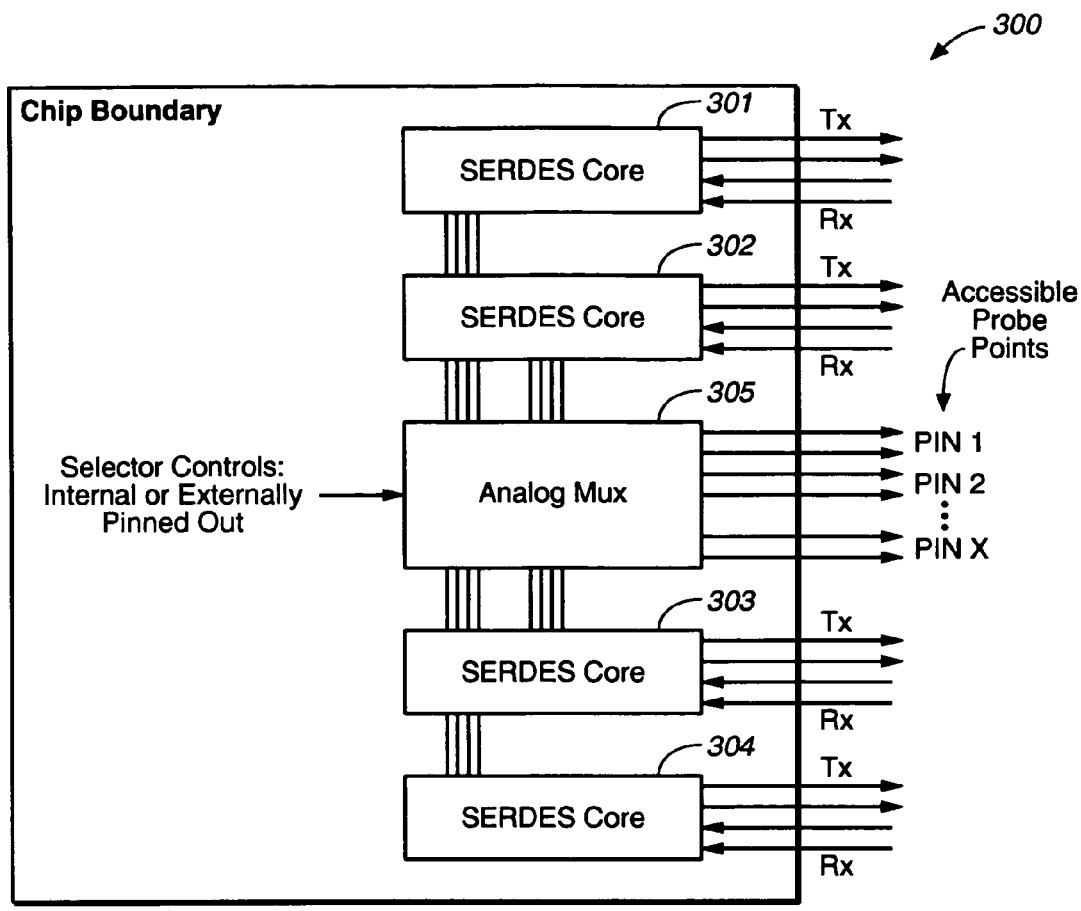
FIG._3
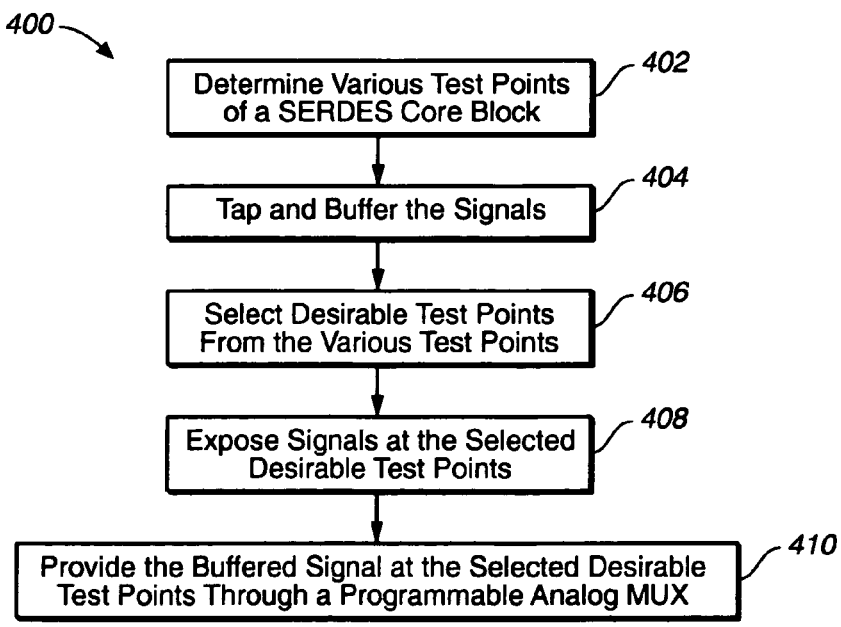
FIG._4

SELECTIVE TEST POINT FOR HIGH SPEED SERDES CORES IN SEMICONDUCTOR DESIGN

FIELD OF THE INVENTION

The present invention generally relates to the field of semiconductor design, and particularly to verifying, testing and debugging systems involving high speed SERializer/DESerializer (SERDES).

BACKGROUND OF THE INVENTION

Integrated circuits and chips have become increasingly complex, with the speed and capacity of chips increasing tremendously. This increase has resulted from advances in design software, fabrication technology, semiconductor materials, and chip design. An increased density of transistors per square centimeter and faster clock speeds, however, make it increasingly difficult to specify and design a chip that performs as specified. The demand for complex custom-designed chips (such as ASICs) has increased with the increasing variety of microprocessor-driven applications and products, yet designing such chips are costly and time consuming.

Integrated structured programmable platforms with serialization/deserialization (SERDES) technology have set a new performance standard for applications that require wide bandwidth capability. Many custom designs utilize SERDES technology to increase system bandwidth and reduce overall system costs. SERDES technology addresses the critical issues that alleviate the I/O bottleneck. The technology compresses slower-speed parallel data into much faster serial data. For example, in a networking application, the serializer in the SERDES block converts 400 MHz parallel data coming from inside the network card to 3.125 Gbps serial data as output to the backplane bus. The deserializer in another SERDES block then retrieves the serial data from the bus and converts it back to slower parallel data.

Conventionally, SERDES cores in ASIC, ASIC platform, and other programmable platforms designs have been implemented to utilize simulation and measurement through probing of the high speed signal to support design, test, and debugging systems. The measurement typically includes measuring the "eye" of the signal at the transmitter, the receiver, and at various points in the transmission path. This allows the engineer to measure jitter and eye height.

High speed SERDES cores have been introduced to operate without visible, or with very small eye openings, relying on signal processing techniques to open the "eye" and recover the data. However, there are many issues to design, test and debug systems involving high speed SERDES cores due to the high speed, mixed signal circuitry involved, and the stringent electronically specifications which they have to meet. Furthermore, as the transmission rates increase, it is increasingly difficult to relate the measured signal at the semiconductor package balls to the signal actually seen at the SERDES receiver on the silicon. The additional impedance and discontinuities of the package and bonding may also impact the signal seen, thus the engineer is unable to "see" these effects as they occur inside the package. In both cases, it is extremely difficult to test and debug such a system through measurement as in one case, the signal is not readily discernible as such in the external probes while in the other case the actual signal may not be probed internal to the chip during normal operation.

One possible solution is to build a probe or measurement system (e.g. a smart oscilloscope, or the like) that has signal processing capabilities as well, and may perform the signal processing to recover the data stream from the probed signal, and then display the raw and recovered signals. However, it does not address the effect of the package on the signal. Further, it assumes that all SERDES will perform identical signal processing, which is unrealistic. It is well known to the art that such a scope may not be calibrated with all possible SERDES cores and technologies.

Other solutions conventionally used are external and internal loopbacks, as well as reverse loopback. Referring now to FIG. 1, a block diagram of SERDES core 100 with various loopbacks is shown. An external loopback 102, 104 takes the data transmitted out of an ASIC's SERDES and physically wires it to the receiver of the same SERDES. This is a good test of complete operation of the transmitter and receiver SERDES silicon all the way through the core and out the package. However, this test works with a single SERDES in a test bed only. Actual system operation is not possible as the SERDES is only able to send test data to itself. This also does not allow testing between different chips or types of chips, as the loopback is to the same chip and same SERDES. Although this is a useful technique, it may not be useful when the problem being investigated only occurs in full system operation. Internal loopbacks are quite similar, but will "loop back" the transmitted data at some point prior to going off the die. The loopback may be at an analog or digital poll in the SERDES. It is typically used for debugging and testing the SERDES itself rather than the system in which it is instantiated.

Reverse loopbacks 106 include taking a received signal end looping it back out to the transmit port of the same SERDES (rather than taking the output of the transmitter and looping it to the receiver). As with the loopback methods described above, this may occur at several points, including a raw loopback, looping back after recovering, and retiming the data, or even taking the digital version of the recovered data and sending it back out all the way through the transmit SERDES. However, the Reverse loopbacks method has been utilized in limited ways. By looping back the receive data to the transmit port, the transmit port is no longer useful in a system environment, hence the Reverse loopbacks method is difficult or impossible to use in a full system test without adding extra unused SERDES paths.

In both loopback methods, loopbacks do not support system testing, as they take up either a receiver or a transmit SERDES port. In addition, neither exposes the internal nature of the signal to the external test point. Basically, the probe at the test point sees the output of a transmit SERDES port, not the processed, or partially processed received signal.

Therefore, it would be desirable to provide a method and system for exposing the processed or partially processed received signal at various external test points for a system involving high speed SERDES cores.

SUMMARY OF THE INVENTION

Accordingly, the present invention provides a method and system for testing a system including high speed SERDES cores through exposing an internal nature of signals. The internal nature of signals may be exposed by tapping the signals at various test points selected from a receiver and/or a transmitter path. The signals may be tapped without being redirected or impeded, while the tapped copy of the signals is made to be exposed to enable probe and measurement.

In an exemplary aspect of the present invention, a method to test a system involving high speed SERDES cores is provided. Several test points in the receiver path may be determined. At each test point, a signal is suitable for being mirrored (tapped). Desirable test points from the determined test points may be selected. The method may take the desirable test points in the receiver path of SERDES cores, and expose the desirable test points by routing signals to corresponding pins/balls on a chip. Signals at the test points to be exposed may include a raw signal as seen on die, a post receive buffer signal, a post equalized signal, a post signal processed signal, and the like.

Each signal may be buffered at a tap point in the SERDES core to avoid impacting the integrity of the used signal when the probes are attached. In this manner, impact of the "taps" on the internal use of the signal may be minimized or eliminated. The buffered signals may be run through a programmable analog multiplexer to select desirable signals to be made available at the chip pins. The signals gated out to the pins may be selected dynamically through registers, selection pins, or the like is implemented on the chip. As such, programmable directing (multiplexing) of data may be utilized to restrict the number of output debug ports. Consequently, the number of the pin counts required for the chip may be controlled.

In an additional aspect of the present invention, only a limited number of such signals per SERDES block may be exposed. The SERDES block may include several SERDES cores. The signals may be available in the core, but need not be run out to the pins unless it is desirable. In this manner, the number of the pin counts may be restricted.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an illustration of a block diagram of a SERDES core with various loopbacks;

FIG. 2 is an illustration of a block diagram of a SERDES core in accordance with an exemplary embodiment of the present invention;

FIG. 3 is an illustration of a block diagram of a SERDES block in accordance with an exemplary embodiment of the present invention; and FIG. 4 is a flow diagram of a method implemented in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention may utilize similar technique to port mirroring in some communications technologies. A desirable signal may be copied with minimal impact on the original signal by buffering the copied signal at the point of the copy. We refer to this as "tapping" the original signal, or "tapping" the signal. Specifically, the present invention may take one or more test points in the receive path of a SERDES core and expose the test points by routing signals to the pins/balls on the chip.

Referring now to FIG. 2, a block diagram of a high speed SERDES core 200 in accordance with an exemplary embodiment of the present invention is shown. In an embodiment of the present invention, the high speed SERDES core 200 may be suitable for being instantiated in ASICs, platform ASICs, other programmable platforms, and high speed silicon solutions. Examples of high speed SERDES cores include LSI logic's GIGABLAZE™, HYDRA™, HYPERPHY™ SERDES cores, and the like. In an alternative embodiment of the present invention, various loopback including external and internal loopbacks, reverse loopback, and the like may be utilized in conjunction with the high speed SERDES core 200. The high speed SERDES core 200 includes a Serializer 204 coupled to a transmit buffer 201 and a Deserializer 202 coupled to a receive buffer 203. The Serializer 204 may convert parallel data into a serial data stream on a transmitter side. The Deserializer 202 may convert the serial data stream back to parallel data on a receiver side. Along the receiver and/or transmitter side path, several test points 206-215 coupled to corresponding buffers 216-230 may be predetermined and are suitable for being exposed. Desirable test points may be selected and taken to be exposed. Signals may be tapped at the desirable test points and buffered. The signals to be tapped may include, but not limited to, a raw signal as seen on die, a post receive buffer signal, a post equalized signal, a post signal processed signal, and the like.

Signals at the desirable test points may be routed to a debug port pin (not shown) on a chip. Preferably, the buffered signals may be provided to an Analog multiplexer (MUX) (not shown). Then, the signals may be multiplexed and directed to a restricted number of pins. In this manner, the required pin count is controlled. It is to be noted that the exposing signals alone is useful but it may not be practical if the number of pins/balls needed on the package containing the die may be multiplied.

As shown in FIG. 3, a SERDES block 300 include several SERDES cores 301-304 and an Analog MUX 305. Each SERDES core 310-304 may output buffered signals to the Analog MUX. As described above, the number of pins on the chip is limited. Thus, in a preferred embodiment of the present invention, only a limited number of the signals (e.g. 2, or 3 signals) per block of SERDES may be routed to corresponding debug port pins (pins) on the chip. For example, 2 signals per block of 4 or 8 GIGABLAZE™ SERDES cores may be implemented in accordance with the present invention. Further, the signals may be available in the SERDES core, but may not be run out to the pins unless it is desirable. Each signal may be buffered at the test points in the SERDES cores 310-304 to avoid impacting the integrity of the used signal when the probes are attached. The buffered signals may then be run through a programmable analog multiplexer (MUX) 305 to select desirable signals to be made available at the pins. Dynamic selection of signals gated out to the pins may be possible through registers, selection pins, or the like, and be implemented on a chip including the SERDES system.

In an exemplary embodiment of the present invention, an ASIC may contain 16 HYDRA™ SERDES cores and supporting Dynamic Feedback Equalization (DFE). The HYDRA™ are instantiated in blocks of 4 HYDRA™ SERDES cores, so one block includes ports 1-4, another 5-8, and the like. Each block of HYDRA™ SERDES cores may have 2 debug transmit ports. These debug transmit port are not full HYDRA™ transmit ports, but only transmit I/O drivers. So the HYDRA™ SERDES core block contains 4 HYDRAs™ transmit ports, 4 HYDRAs™ receive ports, and 2 debug transmits ports. Within each HYDRA™ SERDES core, the engineer may be interested in the raw received signal, the DFE processed signal, and the output of the amplifier just prior to the sampling logic. In the exemplary embodiment of the present invention, the engineer may be able to select a first test point for having raw receive signal to appear at a first pin on the chip and a second test point for having DFE processed signal to appear at a second pin on the chip. The first and the second test points are located in a first HYDRA™ SERDES core. Then, the engineer runs the system in full normal system operation, probing a first signal (a raw signal provided to the receive port) at the first pin at the same time he sees a second signal (a raw signal as seen on the die), and a third signal (the DFE processed version of this signal) at the second pin. Then, the exposed 3 signals may be compared to determine the impact of various equalization settings, emphasis setting, or the like while also comparing the simulated data expectations to the near actual data seen on the chip (distorted only by going back out through the package).

Exposing signals at the various test points may be critical in high speed SERDES cores such as a DFE core or the like, where the conventional output signal may not have a data eye, and as such it may not provide information to whether the signals has been impacted. Additionally, it may be critical to see the post processed DFE result as compared to the input signal, or intermediate signals at various stages of processing in order to debug and tune such a system.

As described above, there are multiple different probe (test) points that would be of interest, potentially, in the receiver SERDES path and/or the transmitter path. It is contemplated that the present invention is suitable for chips with various number of pins and including a large number of interesting test points. The number of interesting test points will grow as the complexity of SERDES cores grows and the number of pins varies on the actual chip. In an embodiment of the present invention, at least 3 pins per SERDES block may be implemented to be SERDES port pins. It is further contemplated that pins on the chip test points are properly balanced for each SERDES block. In the example above, 2 pins on the chip test points were discussed per block of 4 transmit and receive SERDES ports. In another embodiment of the present invention, all SERDES ports on a chip may be multiplexed to a single block of debug ports. In an alternative embodiment of the present invention, only a subset of SERDES cores may include debug port pins. For example, one block of 4 HYDRA™ SERDES cores, out of a total of 64 HYDRA™ SERDES cores on a die, may include 2 debug port pins.

Referring now to FIG. 4, a flow diagram of an exemplary method 400 implemented in accordance with an exemplary embodiment of the present invention is shown. Various test points of interest on a receiver path or a transmitter path may be determined in step 402. In step 404, the signals may be tapped and buffered at the test points in the SERDES core in order to avoid impacting the integrity of the used signal when the probes are attached. Signals to be tapped at the test points may include a raw signal as seen on die, a post receive buffer signal, a post equalized signal, a post signal processed signal, and the like. The signals may be tapped without being redirected or impeded, while the tapped copy of the signals is made to be exposed to enable probe and measurement. In step 406, desirable test points to be exposed may selected. In a preferred embodiment of the present invention, two or three desirable test points per SERDES core may be selected. The desirable test points are exposed by routing signals at the desirable test points to corresponding pins on a chip in step 408. The buffered signals from each of the SERDES cores may be run through a programmable analog MUX to select desirable signals to be made available at corresponding pins in step 410.

The present invention may provide various advantages. The present invention may provide visibility into the receiver (and also transmitter) processing intermediate signals of a high speed SERDES core while the system is in various states such as a normal use state, a debugging state, or a tuning state. The method and system of the present invention may be utilized in a pure debug or demo configuration (as opposed to a normal system set up), but the use during the normal system operation is unique as compared to loopback methods. As the processing in the receiver and transmitter paths become more complex, with more settable options, the ability to probe within these paths becomes more important.

The present invention may provide a proven, fully verified and tested platform with integrated SERDES functionality which usually reduces the total ASIC pin count. The number of package pins/balls is the number of pins or solder balls presented by the package for connection to the board (may be fewer than the number of chip-to-package pads because of internal power and ground planes on the package plane or multiple chips per package). Package Cost (Cost-performance) may be the cost of package envelope and external I/O connections (pins/balls) in cents/pin. For example, by using SERDES, it is possible to replace 16 I/O pins with just two I/O pins (differential pair) per SERDES channel. In a structured ASIC platform with 24 channels, instead of 384 I/O pins, only 48 pins are needed. As such, the present invention may lead to smaller and lower cost chips.

In the exemplary embodiments, the methods disclosed may be implemented as sets of instructions or software readable by a conventional general purpose digital computer system. Further, it is understood that the specific order or hierarchy of steps in the methods disclosed are examples of exemplary approaches. Based upon design preferences, it is understood that the specific order or hierarchy of steps in the method may be rearranged while remaining within the scope and spirit of the present invention. The accompanying method claims present elements of the various steps in a sample order, and are not necessarily meant to be limited to the specific order or hierarchy presented.

It is to be understood that the present invention may be conveniently implemented in forms of a software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for providing visibility of intermediate signals of a high speed SERDES core, comprising:

providing a plurality of test points of the high speed SERDES core;

selecting desirable test points from the plurality of test points further including selecting a first test point for having a raw receive signal to appear at a first pin on a chip and a second test point for having Dynamic Feedback Equalization (DFE) processed signal to appear at a second pin on the chip, the first and second test points located on the high speed SERDES core;

tapping signals at the plurality of test points further including probing a first signal at the first pin and simultaneously detecting at least a second signal and a third signal at the second pin; and exposing the first signal at the first test point;

exposing the second signal and the third signal at the second test point, the second signal being a raw signal as seen on a die, the third signal being a Dynamic Feedback Equalization-processed version of the second signal; and comparing the first signal, the second signal, and the third signal to determine the impact of at least one of an equalization setting or an emphasis setting, and comparing a simulated data expectations to near actual data detected on the chip;

buffering the tapped signals in the high speed SERDES core;

running the buffered signals at the desirable test points through a programmable analog MUX to dynamically select a desirable signal which gates out through a corresponding pin; and directing the multiplexed signals to a restricted number of debug port pins to control required pin count.

2. The method as described in claim 1, wherein the tapped signals include a raw signal, a post receive buffer signal, a post equalized signal, and a post signal processed signal.

3. The method as described in claim 2, wherein a register selects the desirable signal gated out through the corresponding pin.

4. The method as described in claim 2, wherein a selection pin control input selects the desirable signal gated out through the corresponding pin.

5. The method as described in claim 2, wherein the plurality of test points are located in a receive path of the SERDES core.

6. The method as described in claim 2, wherein the plurality of test points are located in a transmit path of the SERDES core.

7. The method as described in claim 1, wherein the buffered signals are available to the user without being run through corresponding pins.

8. The method as described in claim 1, wherein the plurality of test points are coupled to a plurality of buffers containing the buffered signals in the high speed SERDES core.

9. A system for testing a SERDES system including a plurality of SERDES blocks wherein each of the plurality of SERDES blocks includes a plurality of SERDES cores, comprising:

means for providing a plurality of test points of each of the plurality of SERDES cores;

means for selecting desirable test points from the plurality of test points to be exposed, further including means for selecting a first test point for having a raw receive signal to appear at a first pin on a chip and a second test point for having Dynamic Feedback Equalization (DFE) processed signal to appear at a second pin on the chip, the first and second test points located on the high speed SERDES core;

means for tapping signals at the plurality of test points, further including means for probing a first signal at the first pin and simultaneously detecting at least a second signal and a third signal at the second pin; and means for exposing the first signal at the first test point;

means for exposing the second signal and the third signal at the second test point, the second signal being a raw signal as seen on a die, the third signal being a Dynamic Feedback Equalization-processed version of the second signal; and means for comparing the first signal, the second signal, and the third signal to determine the impact of at least one of an equalization setting or an emphasis setting, and comparing a simulated data expectations to near actual data detected on the chip;

means for buffering the tapped signals;

means for providing the buffered signals at the selected desirable test points through a programmable analog MUX to select a desirable signal to gates out through a corresponding pin; and means for directing the multiplexed signals to a restricted number of debug port pins to control required pin count.

10. The system as described in claim 9, wherein the tapped signal includes a raw signal, a post receive buffer signal, a post equalized signal, and a post signal processed signal.

11. The system as described in claim 9, wherein the plurality of test points are located in a receive path of the SERDES core.

12. The system as described in claim 11, wherein the tapped signals include receiver processing intermediate signals.

13. The system as described in claim 9, wherein the plurality of test points are located in a transmit path of the SERDES core.

14. The system as described in claim 13, wherein the exposed signals include transmitter processing intermediate signals.

15. The system as described in claim 9, wherein the plurality of test points are coupled to a plurality of buffers containing the buffered signals in the high speed SERDES core.

16. The system as described in claim 9, wherein the plurality of test points are coupled to a plurality of buffers containing the buffered signals in the each of the plurality of SERDES cores.

17. The system as described in claim 9, wherein the programmable analog MUX is suitable for receiving the buffered signals from a subset of the plurality of SERDES blocks.

18. A system for testing a SERDES system, comprising:

at least one high speed SERDES block, each of the at least one high speed SERDES block including:

a plurality of SERDES cores, each of the plurality of SERDES cores including:

a deserializer in a receiver path, the receiver path including a plurality of test points at which receiver processing intermediate signals are obtained, the plurality of test points including a first test point for having a raw receive signal to appear at a first pin on a chip and a second test point for having Dynamic Feedback Equalization (DFE) processed signal to appear at a second pin on the chip;

a receiver buffer coupled to the deserializer, the receiver buffer for receiving parallel signals and providing the parallel signals to the deserializer, the parallel signals including a first signal at the first pin and a second signal and a third signal at the second pin, the first signal exposed at the first test point, and the second signal and the third signal exposed at the second test point, the second signal being a raw signal as seen on a die, the third signal being a Dynamic Feedback Equalization-processed version of the second signal; and the first signal, the second signal, and the third signal compared to determine the impact of at least one of an equalization setting or an emphasis setting;

a plurality of buffers for containing the obtained signals at the plurality of test points in the receiver path;

a serializer in a transmitter path, the serializer converting parallel data into a serial data stream the transmitter path including a plurality of test points at which transmitter processing intermediate signals are exposed;

a transmitter buffer coupled to the serializer for receiving serial signals, and providing the serial signals to the deserializer;

a plurality of buffers for containing the exposed signals at the plurality of test points in the transmitter path; and an analog multiplexer receiving the buffered signals and selecting a desirable signal through multiplexing the buffered signals provided by the at least one high speed SERDES block, wherein the buffered signals are contained in the plurality of buffers of the at least one high speed SERDES block, and a multiplexed signal is directed to a restricted number of debug port pins for controlling required pin count.

19. The system for testing a SERDES system as described in claim 18, wherein the desirable signal is available at a corresponding pin.

20. The high speed SERDES block as described in claim 18, wherein a subset of the at least one high speed SERDES block provides the buffered signals to the analog multiplexer.

* * * * *